(12) United States Patent
Kim et al.

(10) Patent No.: US 10,446,799 B2
(45) Date of Patent: Oct. 15, 2019

(54) ORGANIC LIGHT-EMITTING DISPLAY DEVICE

(71) Applicant: LG DISPLAY CO., LTD., Seoul (KR)

(72) Inventors: Sookang Kim, Paju-si (KR); KangJu Lee, Goyang-si (KR); Wonhoe Koo, Goyang-si (KR); Hyunsoo Lim, Goyang-si (KR); Mingeun Choi, Asan-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/239,125

(22) Filed: Jan. 3, 2019

(65) Prior Publication Data

US 2019/0157621 A1 May 23, 2019

Related U.S. Application Data

(62) Division of application No. 15/639,299, filed on Jun. 30, 2017, now Pat. No. 10,199,607.

(30) Foreign Application Priority Data

Jun. 30, 2016 (KR) .................. 10-2016-0083123
Nov. 30, 2016 (KR) .................. 10-2016-0162308

(51) Int. Cl.
*H01L 51/52* (2006.01)
*H01L 27/32* (2006.01)

(52) U.S. Cl.
CPC ........ *H01L 51/5275* (2013.01); *H01L 27/326* (2013.01); *H01L 27/3218* (2013.01);
(Continued)

(58) Field of Classification Search
CPC .................................................. H01L 51/5275
See application file for complete search history.

(56) References Cited

U.S. PATENT DOCUMENTS

| | | | |
|---|---|---|---|
| 2002/0044356 A1 | 4/2002 | Arakawa et al. | |
| 2004/0222740 A1 | 11/2004 | Kim | |
| 2012/0001188 A1* | 1/2012 | Hayashi | G02F 1/1339 257/59 |

FOREIGN PATENT DOCUMENTS

CN  104733498 A  6/2015

* cited by examiner

*Primary Examiner* — William A Harriston
(74) *Attorney, Agent, or Firm* — Birch, Stewart, Kolasch & Birch, LLP

(57) ABSTRACT

An organic light-emitting display device can include a substrate including a display area and a non-display area; a thin film transistor disposed on the substrate in the non-display area; an electroluminescent device disposed in the display area; and an overcoat layer disposed on the substrate and including two or more concave portions and two or more convex portions in the display area, in which the two or more concave portions and the two or more convex portions form a plan-view pattern including one of a polygonal pattern having same centers, a polygonal pattern having different centers, a circular pattern having same centers, a circular pattern having different centers, an oval pattern having same centers, an oval pattern having different centers, a spiral pattern, and combinations thereof, and the electroluminescent device includes: a first electrode disposed on the overcoat layer and connecting the electroluminescent device to the thin film transistor; an organic light-emitting layer disposed on the first electrode and configured to emit light; and a second electrode disposed on the organic light-emitting layer.

11 Claims, 24 Drawing Sheets

(52) U.S. Cl.
CPC ...... *H01L 27/3248* (2013.01); *H01L 27/3258* (2013.01); *H01L 27/3262* (2013.01); *H01L 51/5209* (2013.01); *H01L 51/5268* (2013.01)

ORGANIC LIGHT-EMITTING DISPLAY DEVICE

CROSS REFERENCE TO RELATED APPLICATION

This application is a Divisional of U.S. application Ser. No. 15/639,299 filed on Jun. 30, 2017, which claims priority from Korean Patent Application Nos. 10-2016-0162308 filed on Nov. 30, 2016, and 10-2016-0083123 filed on Jun. 30, 2016, which are all hereby incorporated by reference as if fully set forth herein.

BACKGROUND

Field

The present disclosure relates to an organic light-emitting display device.

Description of the Related Art

Organic light-emitting display devices can be fabricated to be relatively light and thin, since organic electroluminescent (EL) devices or organic light-emitting diodes (OLEDs) that can emit light themselves are used therein. In addition, organic light-emitting display devices are not only advantageous in terms of power consumption, because they are driven at low voltages, but also have desirable qualities such as the ability to implement a range of colors, rapid response rates, wide viewing angles, and high contrast ratios. Thus, organic light-emitting display devices for next-generation displays have been actively researched.

Light generated by an organic light-emitting layer of an organic light-emitting display device is emitted from the organic light-emitting display device through several components of the organic light-emitting display device. However, a portion of light generated by the organic light-emitting layer may fail to exit the organic light-emitting display device and be trapped therewithin, thereby causing a problem of low light extraction efficiency in the organic light-emitting display device.

Specifically, for an organic light-emitting display device having a bottom emission structure, about 50% of light generated by the organic light-emitting layer may be trapped within the organic light-emitting display device through total internal reflection or light absorption by an anode electrode while about 30% of light generated by the organic light-emitting layer may be trapped within the organic light-emitting display device through total internal reflection or light absorption by a substrate. That is, about 80% of light generated by the organic light-emitting layer may be trapped within the organic light-emitting display device, and only about 20% of light may be emitted outwardly, leading to poor light extraction efficiency.

To improve the light extraction efficiency of organic light-emitting display devices, a microlens array (MLA) has been attached to an overcoat layer of an organic light-emitting display device. However, even when an MLA is attached to the overcoat layer of the organic light-emitting display device, a large amount of light is trapped within the organic light-emitting display device, leading to a problem in which only a small amount of light is emitted outwardly.

SUMMARY

Accordingly, various aspects of the present disclosure provide an organic light-emitting display device that improves light extraction efficiency.

To achieve these and other advantages and in accordance with the purpose of the present invention, as embodied and broadly described herein, the present invention provides in one aspect an organic light-emitting display device including a substrate including a display area and a non-display area; a thin film transistor disposed on the substrate in the non-display area; an electroluminescent device disposed in the display area; and an overcoat layer disposed on the substrate and including two or more concave portions and two or more convex portions in the display area. Further, the two or more concave portions and the two or more convex portions form a linear pattern in a plan view. In addition, the electroluminescent device includes a first electrode disposed on the overcoat layer and connecting the electroluminescent device to the thin film transistor; an organic light-emitting layer disposed on the first electrode and configured to emit light; and a second electrode disposed on the organic light-emitting layer. Also, the linear pattern of the two or more concave portions and the two or more convex portions comprise one of a zigzag pattern, a streamlined pattern, and combinations thereof.

In another aspect, the present invention provides an organic light-emitting display device including a substrate including a display area and a non-display area; a thin film transistor disposed on the substrate in the non-display area; an electroluminescent device disposed in the display area; and an overcoat layer disposed on the substrate and including two or more concave portions and two or more convex portions in the display area. Further, the two or more concave portions and the two or more convex portions form a plan-view pattern including one of a polygonal pattern having same centers, a polygonal pattern having different centers, a circular pattern having same centers, a circular pattern having different centers, a spiral pattern, and combinations thereof. In addition, the electroluminescent device includes a first electrode disposed on the overcoat layer and connecting the electroluminescent device to the thin film transistor; an organic light-emitting layer disposed on the first electrode and configured to emit light; and a second electrode disposed on the organic light-emitting layer.

Further scope of applicability of the present invention will become apparent from the detailed description given hereinafter. However, the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, which are given by illustration only, and thus are not limitative of the present invention, and wherein.

DETAILED DESCRIPTION

Figure 1:
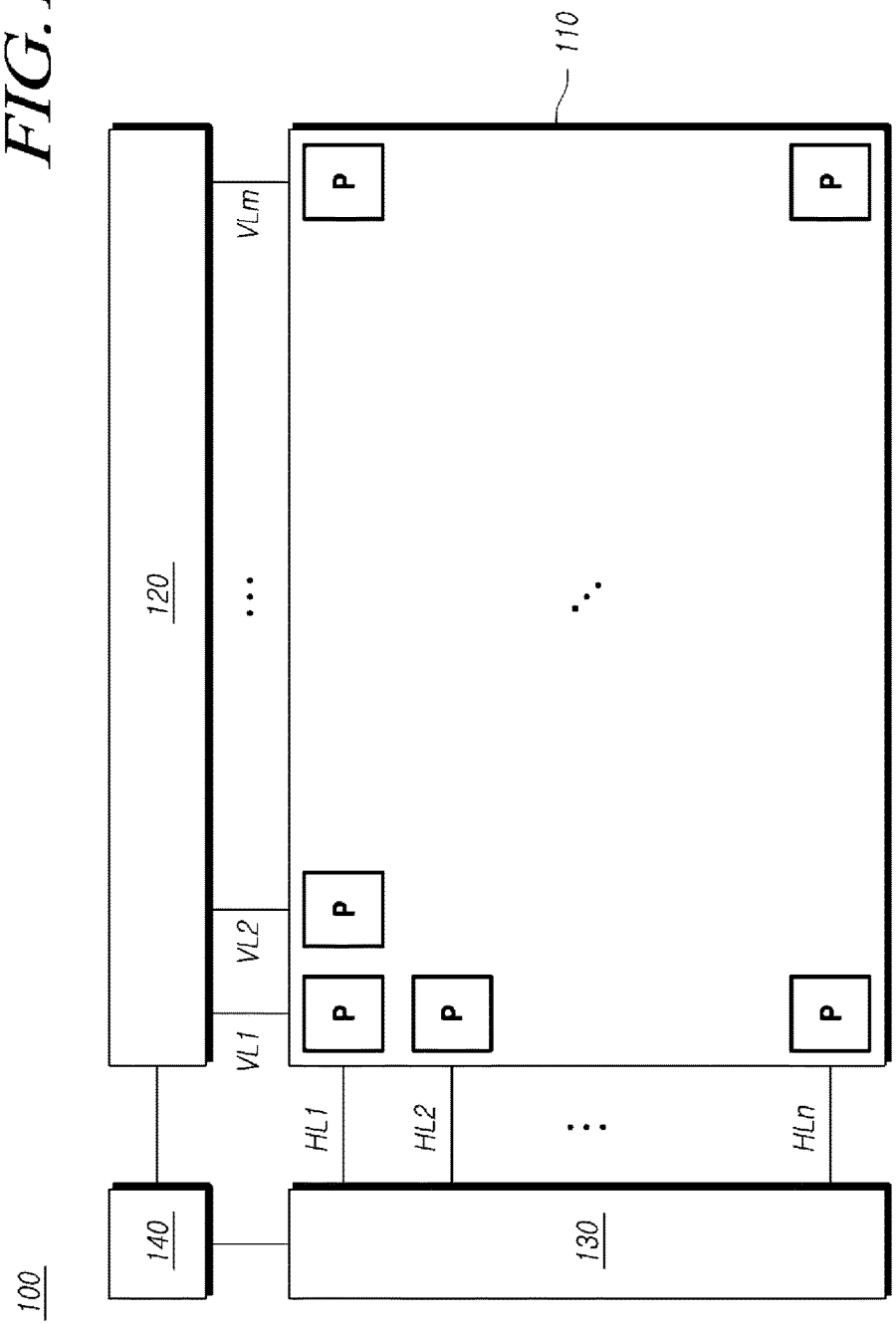
FIG. 1 is a schematic view illustrating an organic light-emitting display device according to exemplary embodiments.

Reference will now be made in detail to exemplary embodiments of the present disclosure, examples of which are illustrated in the accompanying drawings. The embodiments set forth herein are provided for illustrative purposes to fully convey the concept of the present disclosure to a person skilled in the art. The present disclosure should not be construed as being limited to these embodiments and may be embodied in many different forms. In the drawings, the size and thickness of the device may be exaggerated for the sake of clarity. Throughout this document, the same reference numerals and symbols will be used to designate the same or like components.

The advantages and features of the present disclosure and methods of the realization thereof will be apparent with reference from the accompanying drawings and detailed descriptions of the embodiments. The present disclosure should not be construed to be limited to the embodiments set forth herein and may be embodied in many different forms. Rather, these embodiments are provided so that the present disclosure will be thorough and complete, and will fully convey the scope of the present disclosure to a person skilled in the art. In the drawings, the sizes and relative sizes of layers and areas may be exaggerated for the sake of clarity.

When an element or a layer is referred to as being "on" another element or layer, not only can it be "directly on" the other element or layer, but it can also be "indirectly on" the other element or layer via an "intervening" element or layer. In contrast, when an element or a layer is referred to as being "directly on" another element or layer, it will be understood that no intervening element or layer is interposed.

Spatially relative terms such as "below," "beneath," "under," "lower," "above," and "upper" may be used herein for the ease of description of the relationship of an element or components to another element or other components as illustrated in the drawings. The spatially relative terms should be construed as terms encompassing different orientations of the element in use or operation in addition to the orientation depicted in the drawings. For example, when elements illustrated in the drawings are turned over, an element described as "below," "beneath," or "under" another element would then be oriented "above" the other element. Thus, the example term "below," "beneath," or "under" can encompass both orientations of above and below.

In addition, terms such as "first," "second," "A," "B," "(a)," and "(b)" may be used herein to describe the components. It should be understood, however, that these terms are only used to distinguish one component from another component and the substance, order, sequence, or number of the components is not limited by these terms.

FIG. 1 is a schematic view illustrating an organic light-emitting display device 100 according to exemplary embodiments. Referring to FIG. 1, the organic light-emitting display device 100 may be an organic electroluminescent device including two electrodes and an organic layer between the two electrodes or various light-emitting display devices including an organic electronic device.

The organic light-emitting display device 100 can be an organic light-emitting display device displaying an image, a lighting device, a light source, or the like. For example, when the organic light-emitting display device 100 is the organic light-emitting display device, the organic light-emitting display device 100 may be at least one of a bottom emission display device, a top emission display device, a dual emission display device, a flexible display device, and a transparent display device, but is not necessarily limited thereto.

When the organic light-emitting display device 100 is the lighting device, the organic light-emitting display device 100 may be an indoor and outdoor lighting device, a vehicle lighting device, or the like or may be coupled to other apparatuses to be used in the lighting devices described above. For example, the vehicle lighting device may be at least one of headlights, high beam lights, taillights, brake lights, back-up lights, stoplights, fog lamps, turn signal lights, and auxiliary lamps, but is not necessarily limited thereto.

When the organic light-emitting display device 100 is the light source, the organic light-emitting display device 100 can be effectively used in, for example, a backlight of a liquid crystal display (LCD), a lighting apparatus, various sensors, a light source for printers or copy machines, a light source for vehicle gauges, a signal light, a pilot lamp, a light source for an area light-emitting device, a decoration, or various lights.

Hereinafter, the present specification discloses the organic light-emitting display device 100 is an organic light-emitting display device. However, the organic light-emitting display device 100 is not limited to being the organic light-emitting display device and may be a lighting device or a light source as discussed above.

Referring to FIG. 1 again, the organic light-emitting display device 100 includes a panel 110 having a plurality of first lines VL1 to VLm formed in a first direction and a plurality of second lines HL1 to HLn formed in a second direction, a first driving unit 120 supplying a first signal to the plurality of first lines VL1 to VLm, a second driving unit 130 supplying a second signal to the plurality of second lines HL1 to HLn, and a control unit (controller) 140 controlling the first driving unit 120 and the second driving unit 130.

The first driving unit 120 may be a data driving unit which supplies a data voltage to a data wiring, and the second driving unit 130 may be a gate driving unit which supplies a scanning signal to a gate wiring. In the panel 110, a plurality of pixels P are defined according to the intersection of the plurality of first lines VL1 to VLm formed in the first direction and the plurality of second lines HL1 to HLn formed in the second direction.

Further, an electrode connected to a thin film transistor controlling emission of each pixel area in the panel 110 is referred to as a first electrode. An electrode disposed on a front surface of the panel 110 or disposed so as to include two or more pixel areas is referred to as a second electrode. When the first electrode is an anode, the second electrode is a cathode, and vice versa. Hereinafter, descriptions disclose when an anode is an embodiment of the first electrode and a cathode is an embodiment of the second electrode, but the present disclosure is not limited thereto.

In addition, each pixel includes one or more subpixels, for example, three or four subpixels. In more detail, the subpixel is a unit in which one specific kind of a color filter is formed or a unit in which a color filter is not formed and an organic electroluminescent device can emit a special color. Colors defined in the subpixel include red (R), green (G), and blue (B), and selectively include white (W), but the present disclosure is not limited thereto. Each subpixel also includes a separate thin film transistor and an electrode connected to the separate thin film transistor.

In addition, in order to improve light extraction efficiency of an organic light-emitting layer, each subpixel may include a light-scattering layer disposed in a display area such as a microlens array, a nano pattern, a diffuse pattern, or a silica bead.

Hereinafter, the microlens array is described as an embodiment of the light-scattering layer. Embodiments of the present disclosure are not limited to the microlens array, but various structures for scattering light may be coupled and applied to embodiments of the present disclosure.

Figure 2:
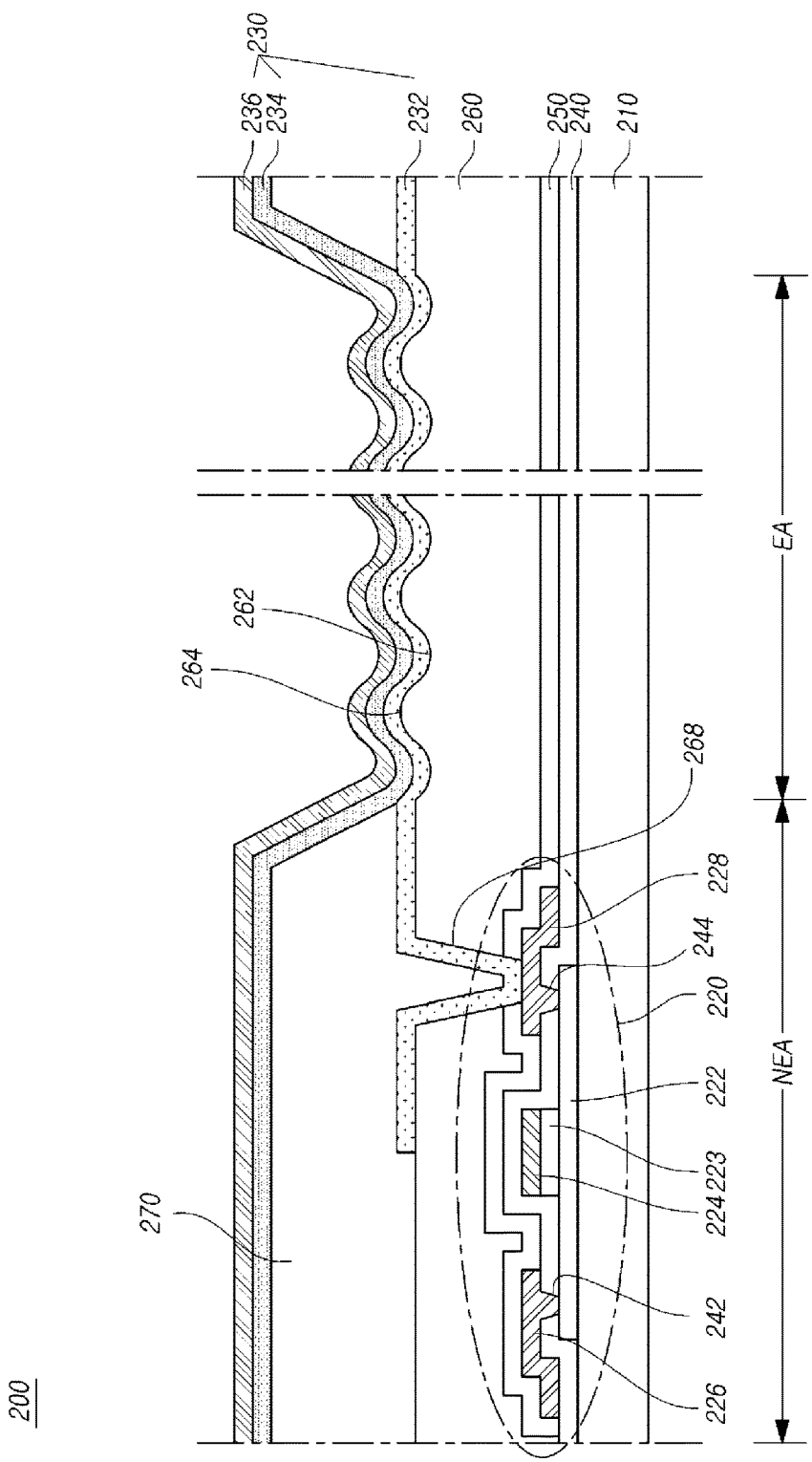
FIG. 2 is a cross-sectional view illustrating an organic light-emitting display device to which a microlens is applied.

Next, FIG. 2 is a cross-sectional view illustrating an organic light-emitting display device 200 to which a microlens is applied. Referring to FIG. 2, the organic light-emitting display device 200 includes a thin film transistor 220 on a substrate 210 and an organic electroluminescent device 230 electrically connected to the thin film transistor 220. The substrate 210 is divided into a display area (e.g., an emission layer EA) and a non-display area NEA, and the thin film transistor 220 is disposed in the non-display area NEA and the organic electroluminescent device 230 is disposed in the display area EA.

In addition, the thin film transistor 220 includes an active layer 222, a gate electrode 224, a source electrode 226, and a drain electrode 228. A gate insulating film 223 is disposed between the active layer 222 and the gate electrode 224. Further, the organic electroluminescent device 230 includes a first electrode 232, an organic light-emitting layer 234, and a second electrode 236.

An interlayer insulating film 240 may be disposed on the gate electrode 224. In addition, the source electrode 226 and the drain electrode 228 contact the active layer 222 through first and second contact holes 242 and 244 in the interlayer insulating film 240. A protective layer 250 is also disposed on the source electrode 226 and the drain electrode 228.

In addition, an overcoat layer 260 is disposed on the substrate 210 including the protective layer 250. The first electrode 232 of the organic electroluminescent device 230 connected to the drain electrode 226 of the thin film transistor 220 is disposed on the overcoat layer 260. A bank 270 exposing a portion of the first electrode 232 to define a pixel is also disposed on the overcoat layer 260. Further, the organic light-emitting layer 234 is disposed on the bank 270 and the first electrode 232 exposed by the bank 270.

Here, the organic light-emitting layer 234 may only be disposed on the first electrode 232 exposed by the bank 270 or may be disposed on both of the first electrode 232 and the bank 270. In addition, the second electrode 236 of the organic electroluminescent device 230 is disposed so as to overlap the organic light-emitting layer 234 and the bank 270. The first electrode 232 is connected to the thin film transistor 220 via an extension portion 268 extending from the concave portions 262 and the convex portions 264 as shown in FIG. 2.

In order to improve light extraction of the organic light-emitting display device 200, the overcoat layer 260 includes a plurality of concave portions 262 and a plurality of convex portions 264 in the display area EA. In more detail, the structure including the plurality of concave portions 262 and the plurality of convex portions 264 is referred to as a microlens array (MLA).

In this instance, among light incident on an interface between the microlens array (MLA) and the first electrode 232 of the organic light-emitting display device 200, light incident at an incident angle less than or equal to a critical total reflection angle is emitted to the outside of the substrate 210 as it is. Light incident at an incident angle greater than or equal to the critical total reflection angle hits the microlens and a light path thereof is changed. Finally, the light is emitted to the outside of the substrate 210. Therefore, it is possible to improve light extraction efficiency of the organic light-emitting display device 200 to which the microlens is applied.

Figure 3:
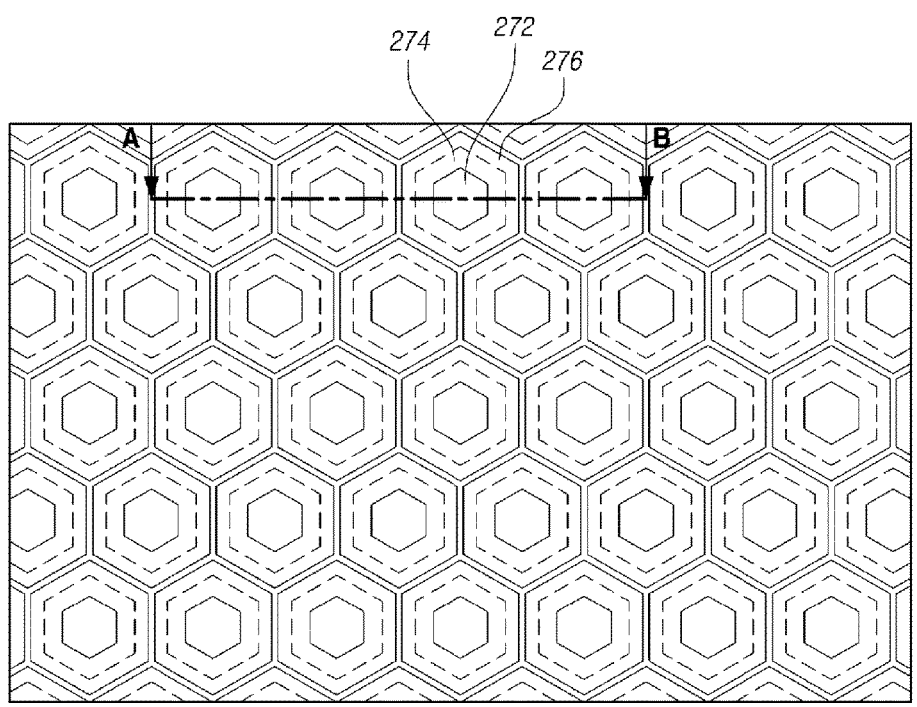
FIG. 3 is a plan view illustrating the organic light-emitting display device to which the microlens is applied.
Figure 4:
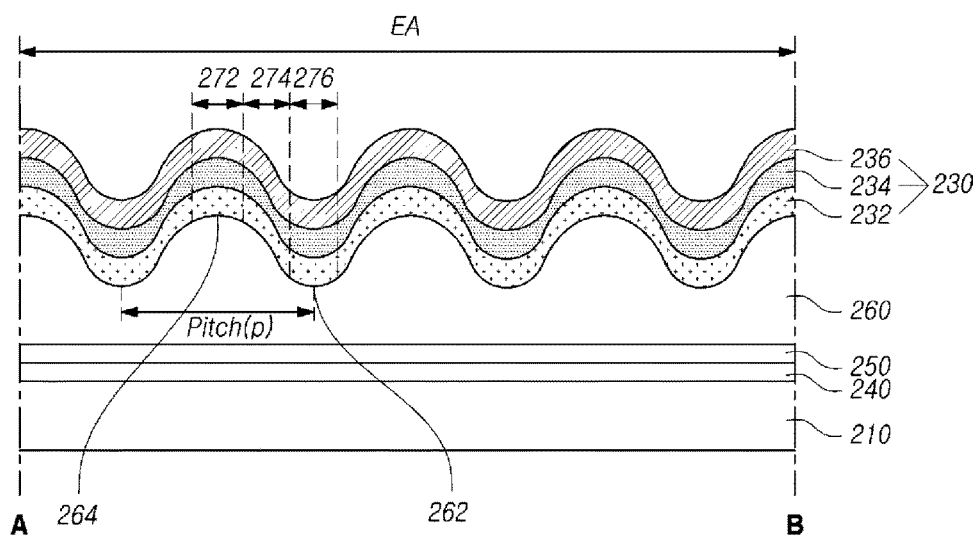
FIG. 4 is a cross-sectional view taken along line A-B of the organic light-emitting display device to which the microlens is applied.

FIG. 3 is a plan view illustrating the organic light-emitting display device 200 to which the microlens is applied, and FIG. 4 is a cross-sectional view taken along line A-B of the organic light-emitting display device 200. Referring to FIGS. 3 and 4, the organic light-emitting display device 200 is divided into a first area 272 corresponding to the convex portion 264 of the overcoat layer 260, a second area 274 disposed between the concave portion 262 and the convex portion 264 of the overcoat layer 260, and a third area 276 corresponding to the concave portion 262 of the overcoat layer 260 with respect to a thickness of the organic light-emitting layer 234 in the organic electroluminescent device 230 in an area corresponding to an area in which the microlens is disposed.

When the organic light-emitting layer 234 is formed through a deposition process having linearity, the thickness of the organic light-emitting layer 234 formed in the second area 274 corresponding to an inclined plane is thinner than that of the organic light-emitting layer 234 formed in each of the first area 272 and the third area 276 with respect to a direction perpendicular to an inclined plane of the second area 274.

Therefore, because the thickness of the organic light-emitting layer 234 in the second area 274 is thinner than that of the organic light-emitting layer 234 in each of the first area 272 and the third area 276, the organic electroluminescent device 230 mostly emits light in the second area 274 due to high current density in the second area 274. In addition, because an incident angle of light incident on an inclined plane of the microlens is mostly concentrated inside of a critical total reflection angle in an area corresponding to the second area 274, multiple reflection is realized to improve light extraction efficiency.

When the second area 274 mostly emitting light due to high current density in a display area is increased at the time of applying the microlens, the light extraction efficiency is improved. A distribution of the second area 274 can also match a distribution of a microlens structure including the concave portion 262 and the convex portion 264 of the overcoat layer 260. In order to increase the distribution of the microlens structure, when a pitch of the microlens structure is relatively decreased, the distribution of the second area 274 is also increased. As a result, the entire area of the second area 274 can be increased, thereby improving light extraction efficiency.

Figure 5:
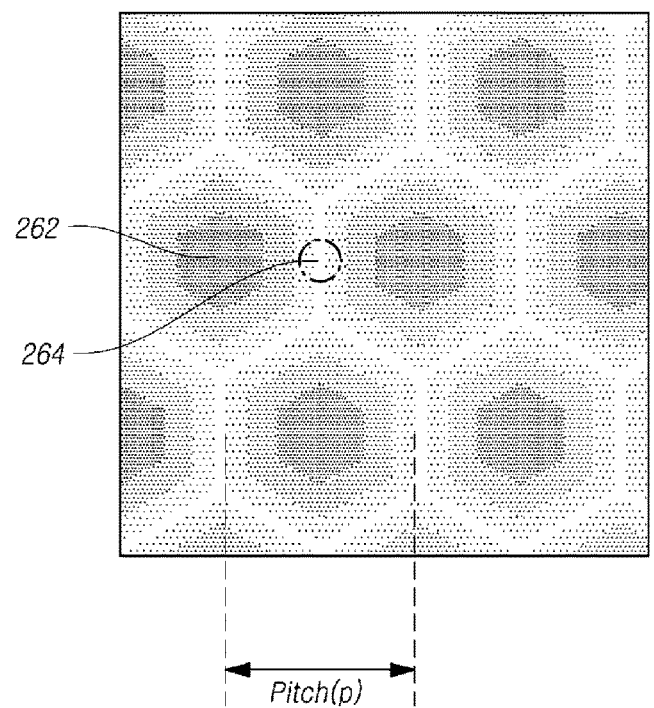
FIGS. 5 and 6 illustrate plan-view shapes of concave portions and convex portions of an overcoat layer.
Figure 6:
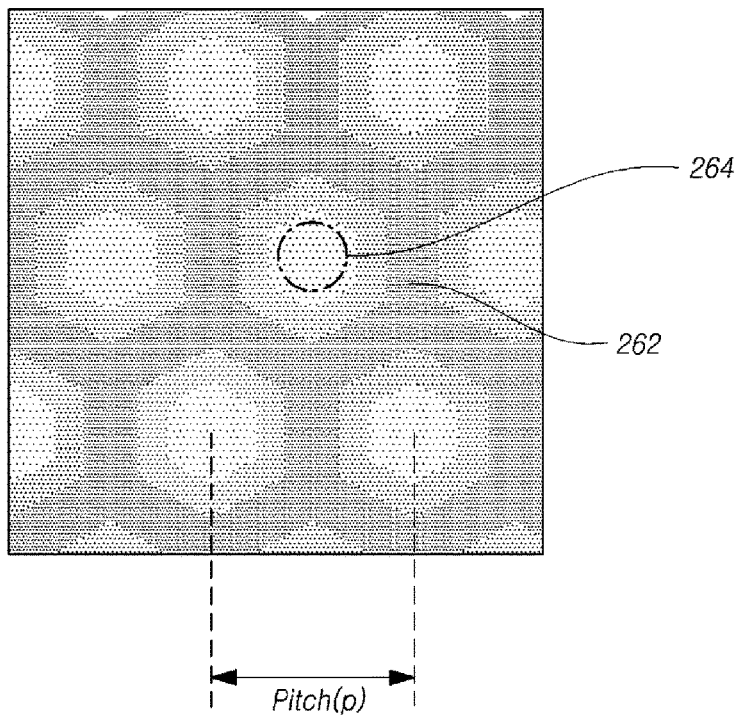

Next, FIGS. 5 and 6 illustrate plan-view shapes or patterns of the concave portions 262 and the convex portions 264 of the overcoat layer 260. As illustrated in FIG. 5, the overcoat layer 260 may have a honeycomb pattern, in a plan view, in which a specific shape, for example, the convex portion 264 having a hexagonal shape, surrounds the concave portion 262.

Since a microlens structure is oriented toward the substrate 210 by the overcoat layer 260 having the honeycomb pattern, in a plan view, in which the convex portion 264 having the hexagonal shape surrounds the concave portion 262, the overcoat layer 260 can be used in a bottom emission organic light-emitting display device displaying an image toward the substrate 210.

In a process, the overcoat layer 260 having the honeycomb pattern in FIG. 5 can be fabricated by applying a material of the overcoat layer 260 to the entirety of the substrate 210, irradiating light onto a honeycomb pattern mask having an opened exposed portion corresponding to the concave portion 262, and then etching an area onto which light is irradiated using an etchant. The material of the overcoat layer 260 may be a general positive photoresist, but is not limited thereto.

As illustrated in FIG. 6, the overcoat layer 260 may have a honeycomb pattern in which a member having a specific shape or pattern, for example, the concave portion 262 having a hexagonal shape surrounds the convex portion 264. Because a microlens structure is oriented in the direction opposite to the substrate 210 by the overcoat layer 260 having the honeycomb pattern, in a plan view, in which the hexagonal concave portion 262 surrounds the convex portions 264, the overcoat layer 260 can be used in a top emission organic light-emitting display device displaying an image in the direction opposite to the substrate 210.

In a process, the overcoat layer 264 having the honeycomb pattern in FIG. 6 can be fabricated by applying a material of the overcoat layer 260 to the entirety of the substrate 210, irradiating light onto a honeycomb pattern mask having an opened exposed portion corresponding to the convex portion 264, and then etching an area onto which light is not irradiated using an etchant.

The material of the overcoat layer 260 may be general negative photoresist, but is not limited thereto. As described above, in order to relatively decrease the pitch of the microlens structure to increase the distribution of the microlens structure, one of an opened exposed portion and an unopened unexposed position should be reduced from a mask.

Figure 7A:
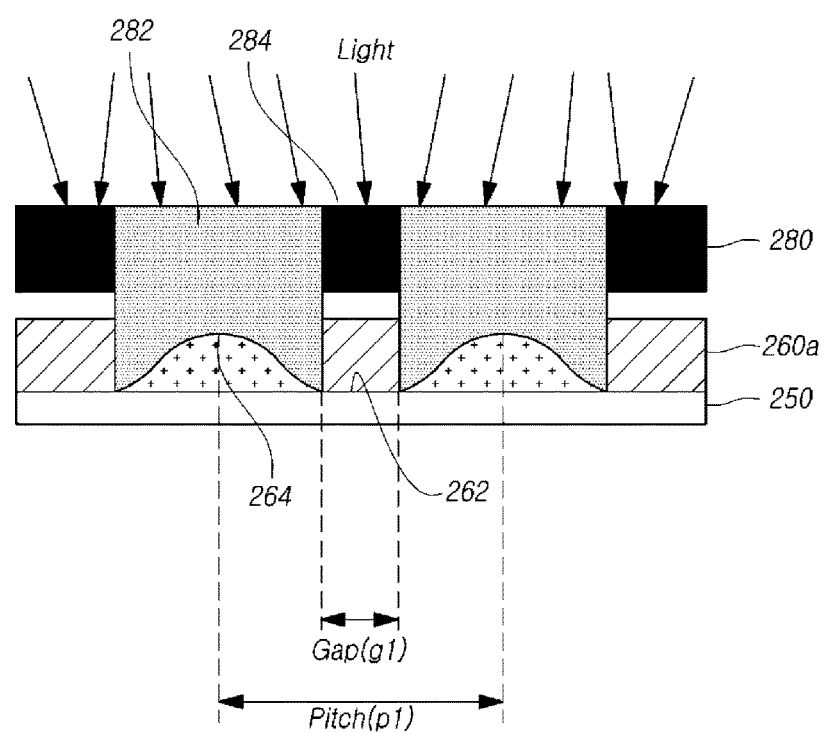
FIGS. 7A and 7B illustrate defects of the overcoat layer when an area of an exposed portion of a mask is reduced.
Figure 7B:
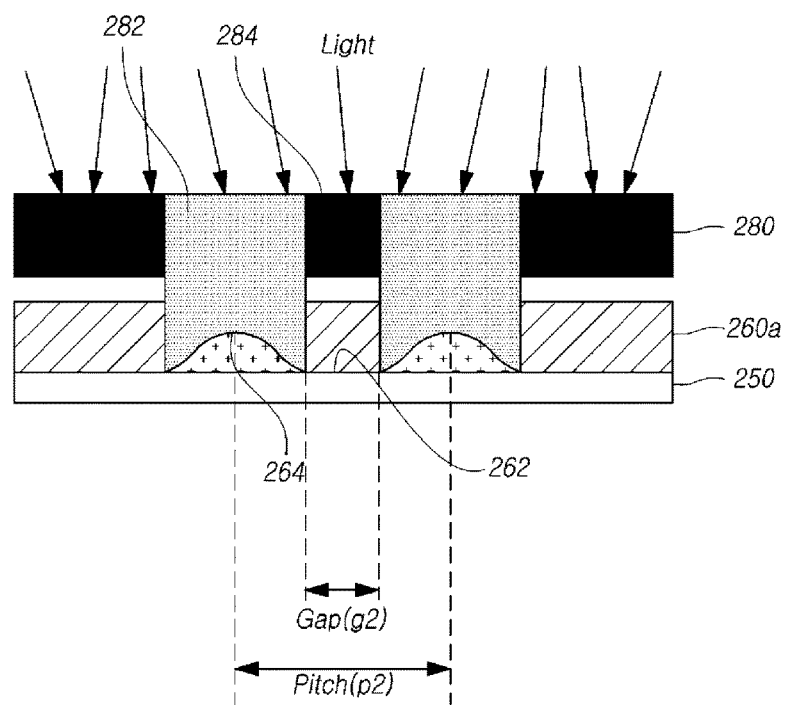

Next, FIGS. 7A and 7B illustrate defects of the overcoat layer 260 when an area of an exposed portion 282 of a mask 280 is reduced in a process. As illustrated in FIG. 7A, when the area of the exposed portion 282 of the mask 280 is relatively wide, the concave portion 262 or the concave portion 264 of the overcoat layer 260 can secure an optimal shape. However, when the area of the exposed portion 282 is reduced in the mask 280 so as to relatively reduce a pitch of a microlens structure (from p1 to p2) as illustrated in FIG. 7B, an actual amount of exposed light passing through the exposed portion 282 of the mask 280 is decreased. Thus, a material 260a of the overcoat layer 260 is not sufficiently cured, leading to a decrease in a size and a height of the concave portion 262 and the convex portion 264 of the overcoat layer 260, i.e., a problem that an optimal shape is not secured.

Figure 8A:
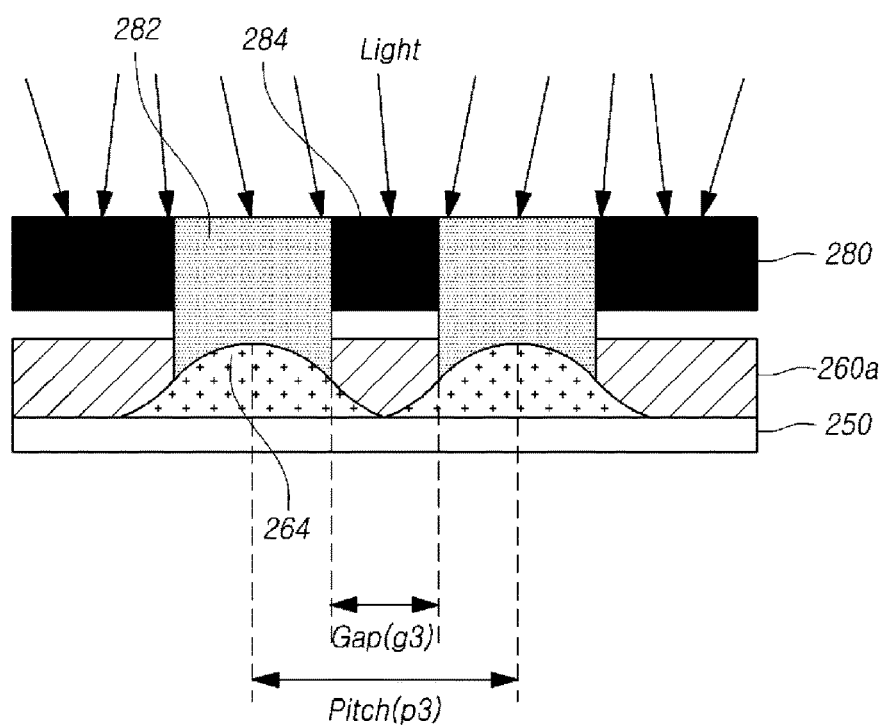
FIGS. 8A and 8B illustrate defects of the overcoat layer when an area of an unexposed portion of a mask is reduced.
Figure 8B:
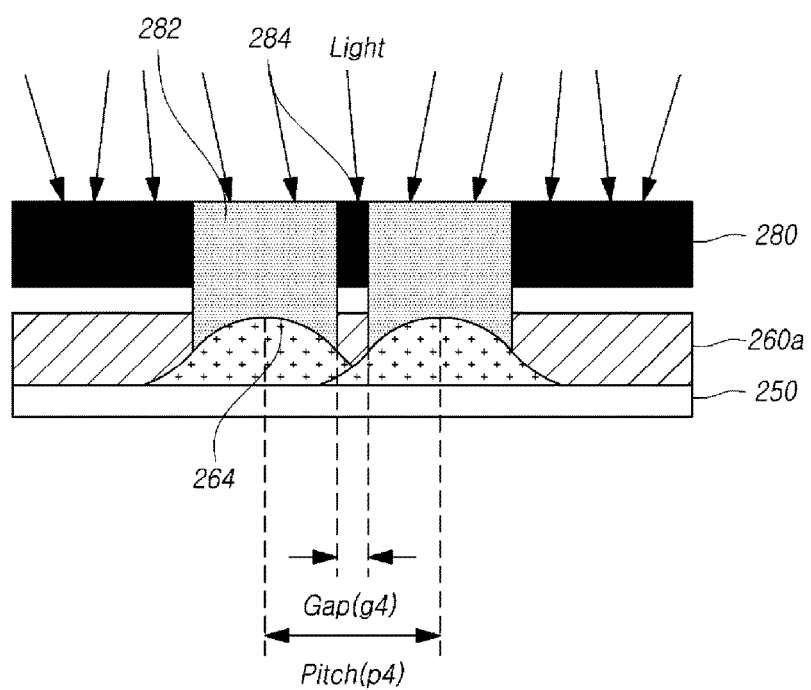

FIGS. 8A and 8B illustrate defects in the overcoat layer 260 when the area of an unexposed portion 284 of the mask 280 is reduced. As illustrated in FIG. 8A, when the area of the unexposed portion 284 of the mask 280 is relatively wide, a distance between the concave portions 262 or the concave portions 264 of the overcoat layer 260, i.e., a gap can be secured. However, when a width of the unexposed portion 284, i.e., a gap is reduced (from g3 to g4) in the mask 280 so as to relatively reduce a pitch of a microlens structure (from p3 to p4) as illustrated in FIG. 8B, optical interference may occur between the exposed portions 282, leading to the flattening of the concave portions 262 or the convex portions 264, i.e., a problem in which a final shape is not secured.

Hereinafter, because an organic light-emitting display device according to exemplary embodiments of the present disclosure described later includes an overcoat layer having a structure in which two or more concave portions and two or more convex portions are arranged in a linear shape or pattern, rather than having a honeycomb structure in which a convex portion surrounds a concave portion or the concave portion surrounds the convex portion, the present disclosure is directed to provide an organic light-emitting display device that improves light extraction efficiency in a display area by minimizing a pitch between concave portions or convex portions.

Figure 9:
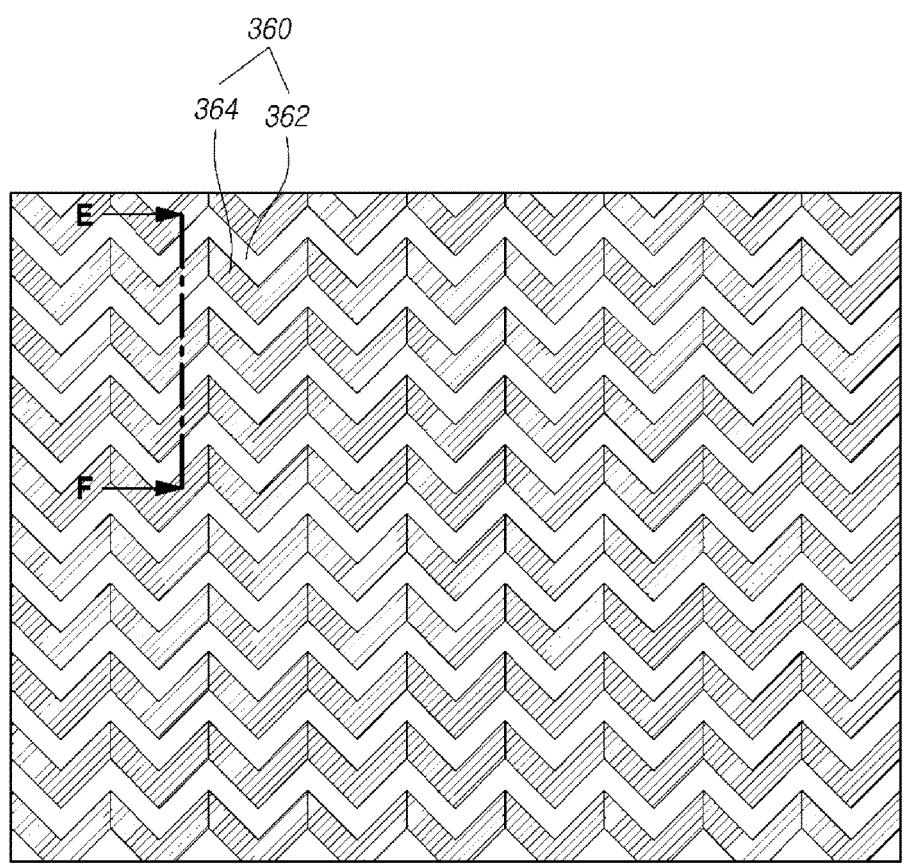
FIG. 9 is a plan view illustrating an organic light-emitting display device according to an exemplary embodiment.
Figure 10:
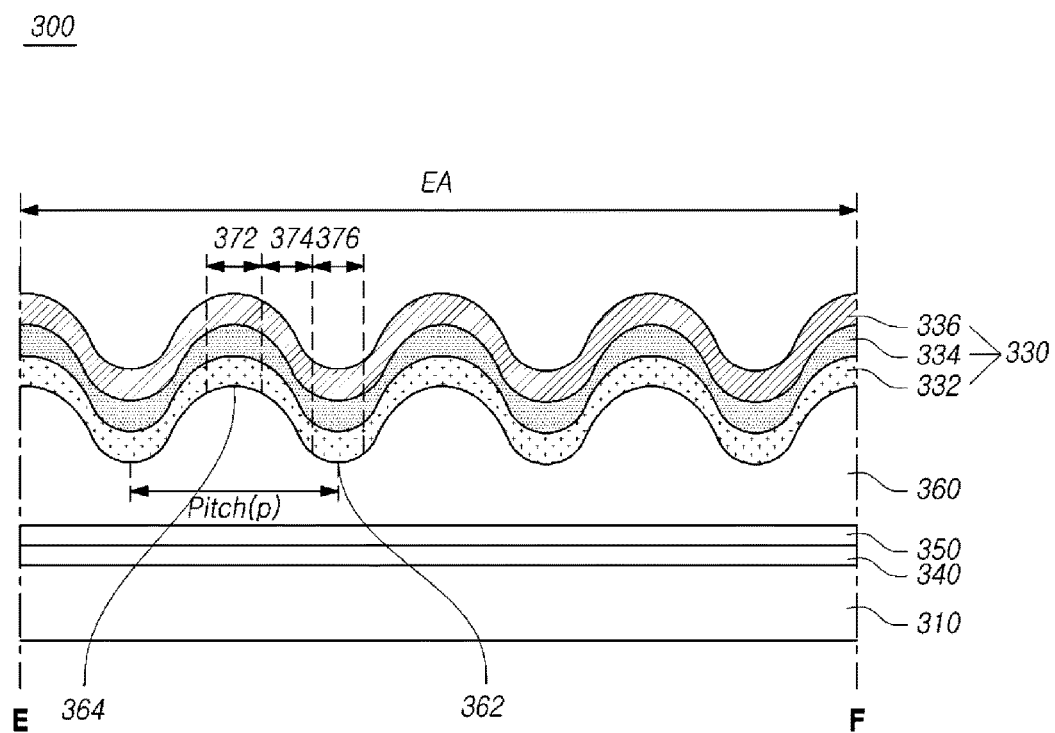
FIG. 10 is a cross-sectional view taken along line E-F of FIG. 9.

FIG. 9 is a plan view illustrating an organic light-emitting display device 300 according to an exemplary embodiment, and FIG. 10 is a cross-sectional view taken along line E-F of FIG. 9. Referring to FIGS. 2, 9 and 10, the organic light-emitting display device 300 includes a substrate 310 divided into a display area and a non-display area, an overcoat layer 360 disposed on the substrate 310 and including two or more concave portions 362 and two or more convex portions 364 having a linear shape or pattern in a plan view, a first electrode 332 disposed on the overcoat layer 360, and an organic light-emitting layer 334 disposed on the first electrode 332, and a second electrode 336 disposed on the organic light-emitting layer 334. The term "linear shape" includes any type of linear shape such as a straight line, a streamlined shape, and combinations thereof.

Because the two or more concave portions 362 and the two or more convex portions 364 are arranged in the linear shape or pattern in the overcoat layer 360, a pitch p between the concave portions 362 or the convex portions 364 can be minimized in an exposure process using a mask. The first electrode 332, the organic light-emitting layer 334, and the second electrode 336 constitute an organic electroluminescent device 330 electrically connected to the thin film transistor 220 illustrated in FIG. 2.

Further, an interlayer insulating film 340 is disposed on the thin film transistor 220 including the active layer 222, the gate electrode 224, the source electrode 226, and the drain electrode 228 illustrated in FIG. 2. A protective layer 350 is disposed on the interlayer insulating film 340. In addition, the overcoat layer 360 is disposed on the substrate 310 including the protective layer 350.

The first electrode 332 of the organic electroluminescent device 330 electrically connected to the thin film transistor 220 is disposed on the overcoat layer 360. The bank (270 of FIG. 2) exposing a portion of the first electrode 332 to define a pixel is disposed on the overcoat layer 360. The bank is called a pixel definition layer. In addition, the organic light-emitting layer 334 is disposed on the bank and the first electrode 232 exposed by the bank.

The second electrode 336 of the organic electroluminescent device 330 is disposed so as to overlap the organic light-emitting layer 334. In addition, the organic light-emitting display device 300 applicable to exemplary embodiments of the present disclosure may further include a color filter layer disposed on the protective layer 350 or the second electrode 336. The color filter layer may only be disposed in some subpixels of a plurality of subpixels constituting the organic light-emitting display device 300.

Figure 11:
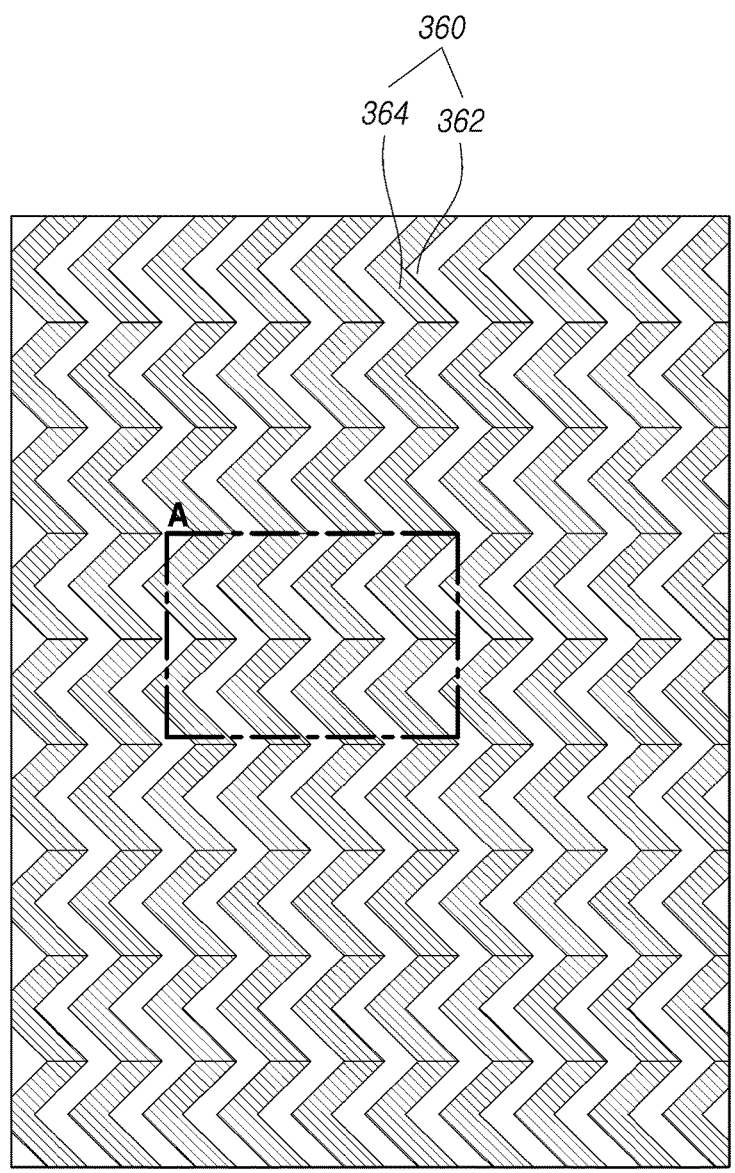
FIG. 11 illustrates another example of a direction of concave portions and convex portions of an overcoat layer of FIG. 9.
Figure 13:
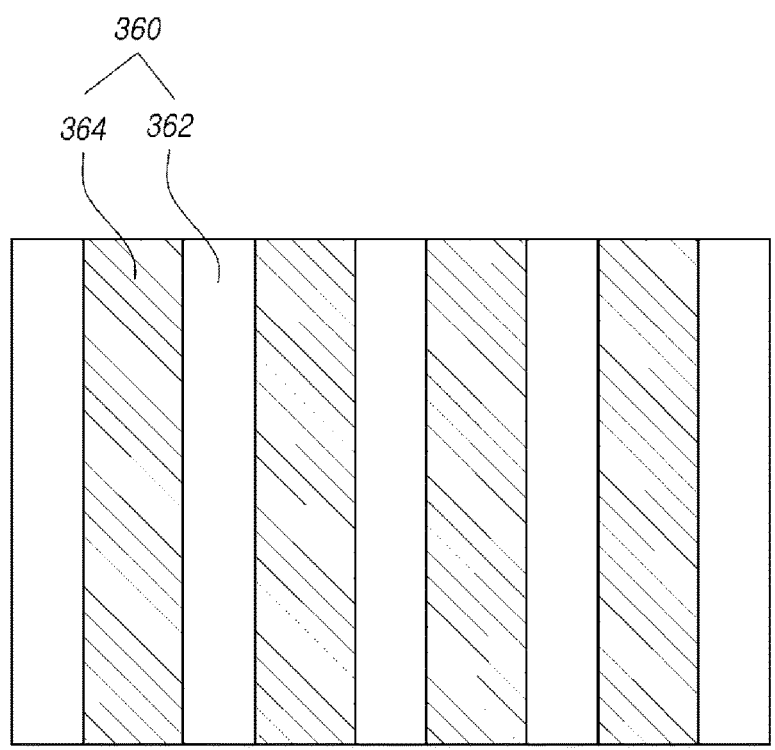
FIGS. 13 and 14 illustrate other examples of shapes of concave portions and convex portions of an overcoat layer of FIG. 9.
Figure 14:
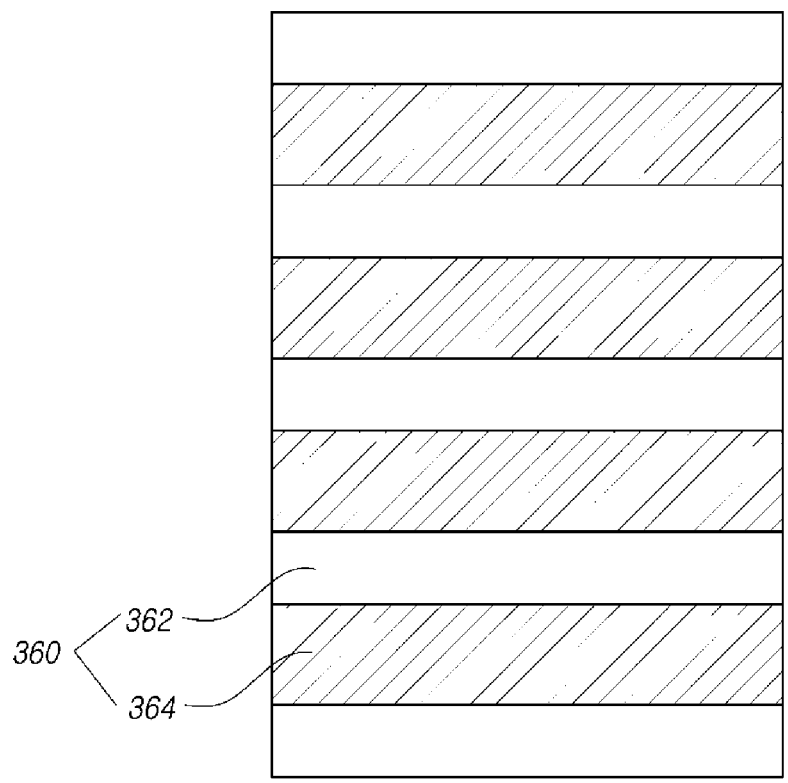

The two or more concave portions 362 and the two or more convex portions 364 may have a plan-view shape selected from among a zigzag shape or pattern as illustrated in FIGS. 9 and 11, a linear shape or pattern as illustrated in FIGS. 13 and 14, a streamlined shape or pattern, and combinations thereof. When the two or more concave portions 362 and the two or more convex portions 364 are arranged in the zigzag shape or pattern or the streamlined shape or pattern rather than the linear shape or pattern, the organic electroluminescent device 330 can emit light in various directions rather than in a single direction, thereby improving a viewing angle.

Figure 12:
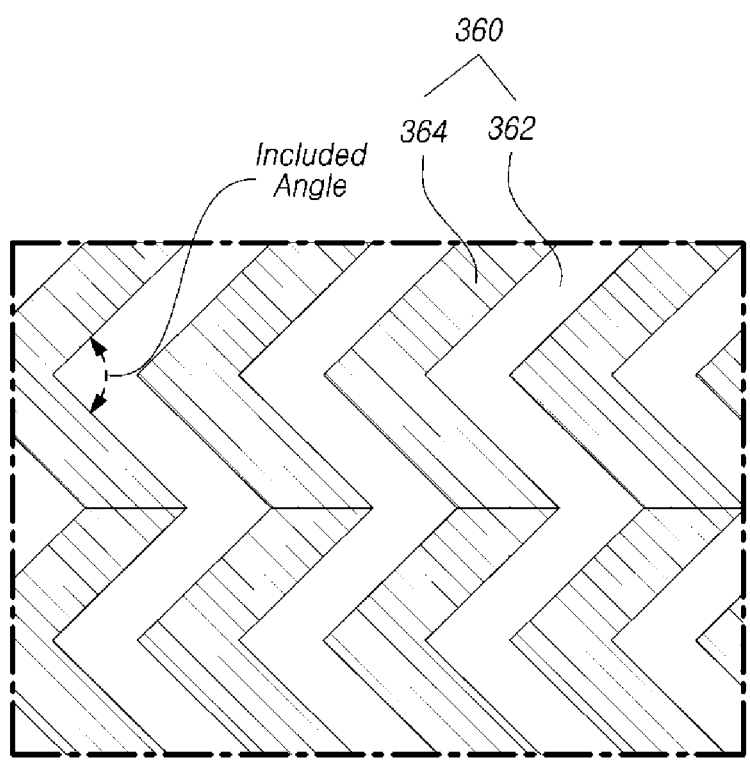
FIG. 12 is an enlarged plan view of portion "A" of FIG. 11.

When the two or more concave portions 362 and the two or more convex portions 364 are arranged in the zigzag shape or pattern as illustrated in FIGS. 9 and 11, an included angle of the zigzag shape or pattern may be in the range of about 80° to about 120° as shown in FIG. 12, but is not limited thereto. As described above, when the two or more concave portions 362 and the two or more convex portions 364 are arranged in the zigzag shape or pattern or the streamlined shape or pattern, light can be emitted in various directions to improve a viewing angle. When the included angle is less than about 80° or more than about 120°, the zigzag shape or pattern or the streamlined shape or pattern approaches a linear shape. Thus, an improvement effect of the viewing angle is relatively lowered. In other words, when the included angle is in the range of about 80° to about 120°, an improvement effect of the viewing angle is maximized.

Further, the two or more concave portions 362 and the two or more convex portions 364 may be linearly arranged on the substrate 310, in a first direction as illustrated in FIGS. 9 and 13 or a second direction, different from the first direction, as illustrated in FIGS. 11 and 14. The first direction and the second direction may respectively be a horizontal direction and a vertical direction and may be perpendicular to each other, but the present disclosure is not limited thereto. In other words, because the direction of the two or more concave portions 362 and the two or more convex portions 364 is not limited, the degree of freedom is raised when the organic light-emitting display device 300 is designed.

In addition, a pitch p between the two or more concave portions 362 or the two or more convex portions 364 may be greater than or equal to a specific distance, but is not limited thereto. The pitch p between the two or more concave portions 362 or the two or more convex portions 364 may also be reduced to a specific distance or less in an exposure process forming the two or more concave portions 362 and the two or more convex portions 364 in the overcoat layer 360 so as to be arranged in a linear shape or pattern, using a mask.

A material of the overcoat layer 360 is not limited, but may be a positive photoresist or a negative photoresist. When the material of the overcoat layer 360 is the positive photoresist, the pitch p between the two or more concave portions 362 or the two or more convex portions 364 may be less than or equal to a specific distance, but is not limited thereto. In addition, when the material of the overcoat layer 360 is the negative photoresist, the pitch p between the two or more concave portions 362 or the two or more convex portions 364 may be greater than or equal to a specific distance, but is not limited thereto. When the material of the overcoat layer 360 is the positive photoresist, the pitch p between the two or more concave portions 362 or the two or more convex portions 364 may be further reduced in an exposure process forming the two or more concave portions 362 and the two or more convex portions 364 in the overcoat layer 360 so as to be arranged in a linear shape or pattern, using a mask.

In the embodiment described above, the two or more concave portions 362 and the two or more convex portions 364 have been arranged in the linear shape or pattern, but the present disclosure is not limited thereto. For example, light extraction efficiency in a display area can be further improved by minimizing a pitch between concave portions or convex portions, due to the concave portions and the convex portions arranged in a shape or pattern different from a honeycomb structure in which the convex portion surrounds the convex portions or the concave portion surrounds the convex portion.

Hereinafter, a display device including an overcoat layer will be described in more detail with reference to another exemplary embodiment. The overcoat layer includes two or more concave portions and two or more convex portions having a different plan-view shape or pattern selected from among a multi-shape, a plurality of multi-shapes having different centers, a spiral shape, and combinations thereof.

Figure 15A:
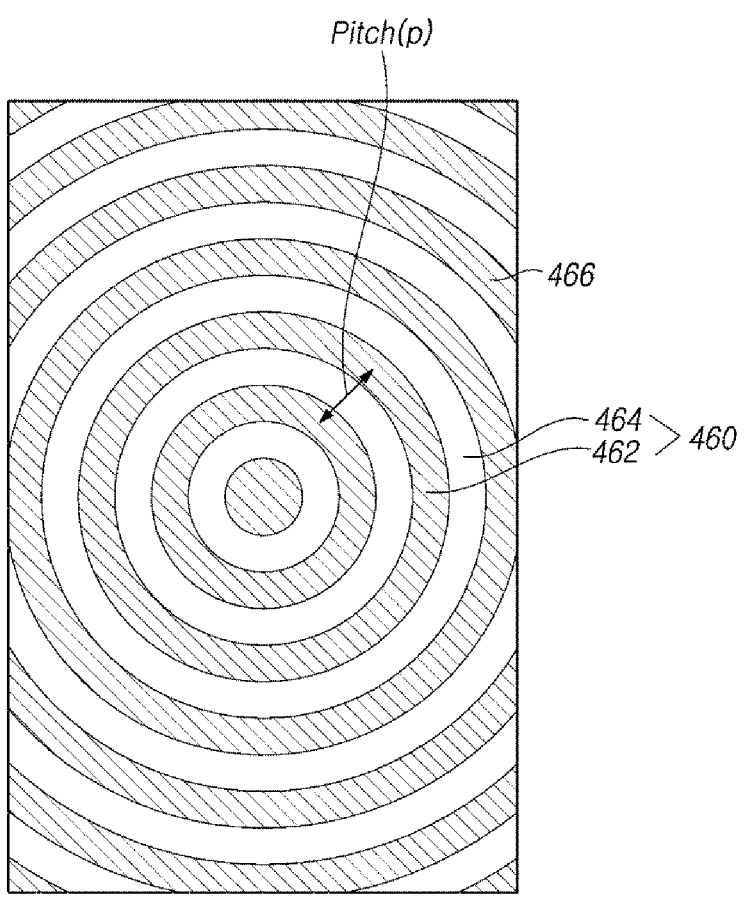
FIGS. 15A, 15B, 15C and 15D are plan views illustrating an organic light-emitting display device according to another exemplary embodiment.
Figure 15B:
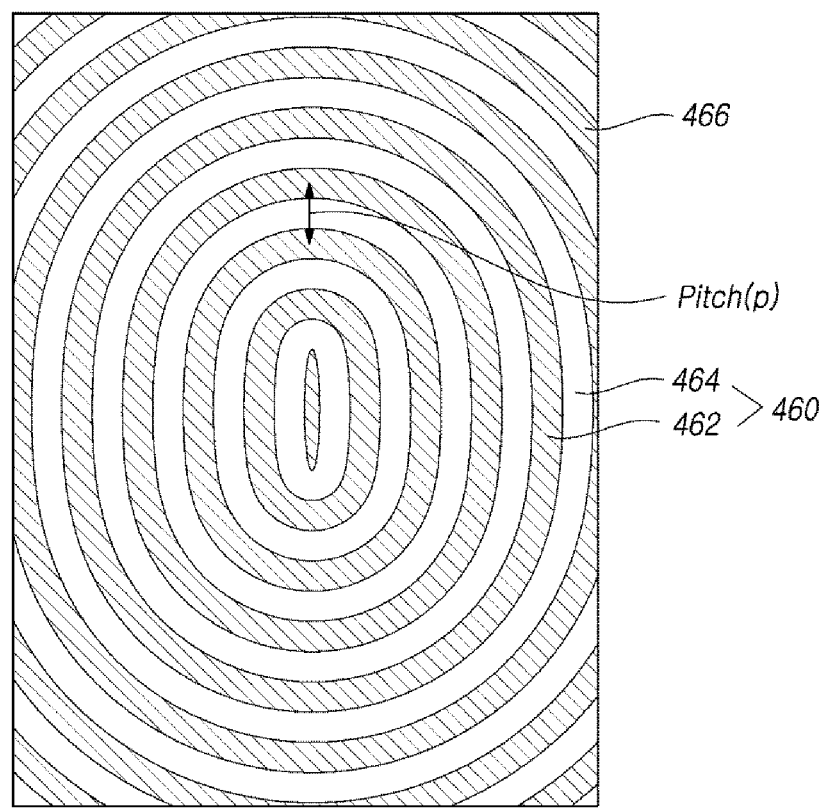
Figure 15C:
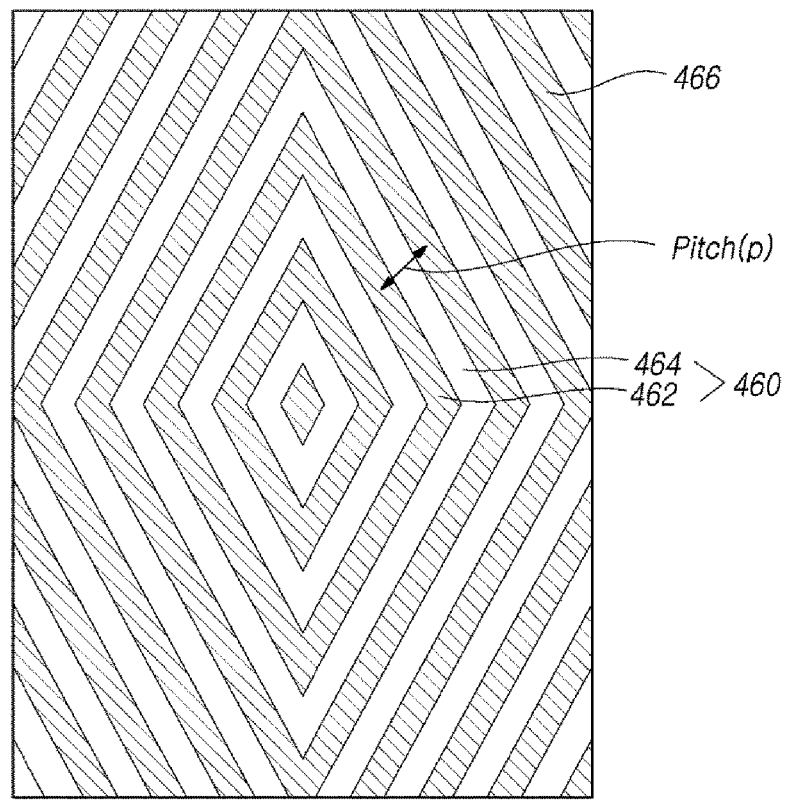
Figure 15D:
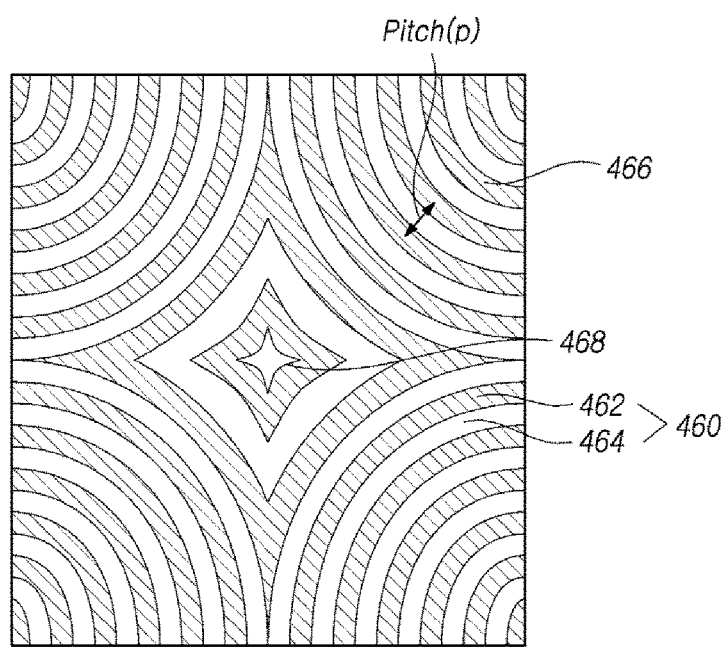
Figure 16A:
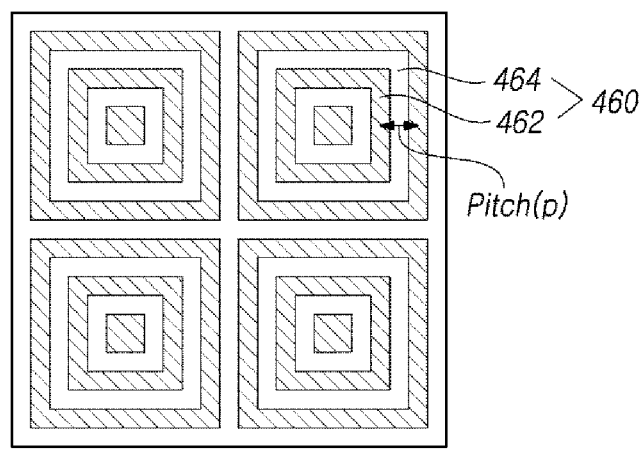
FIGS. 16A and 16B illustrate other examples of shapes of concave portions and convex portions of an overcoat layer in FIGS. 15A to 15D.
Figure 16B:
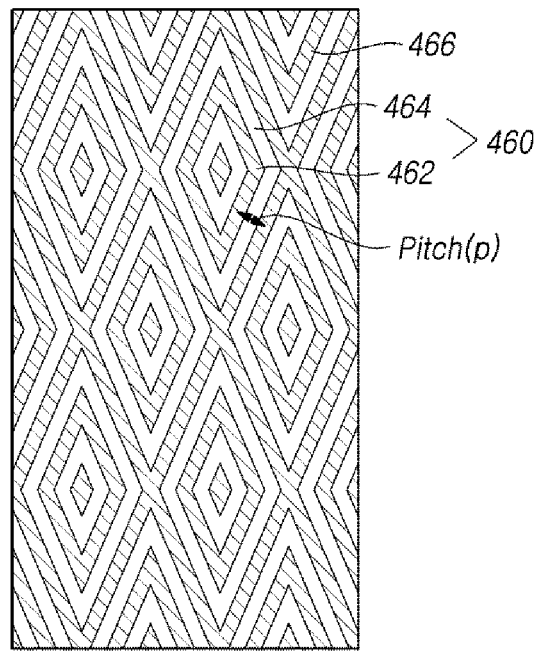
Figure 17A:
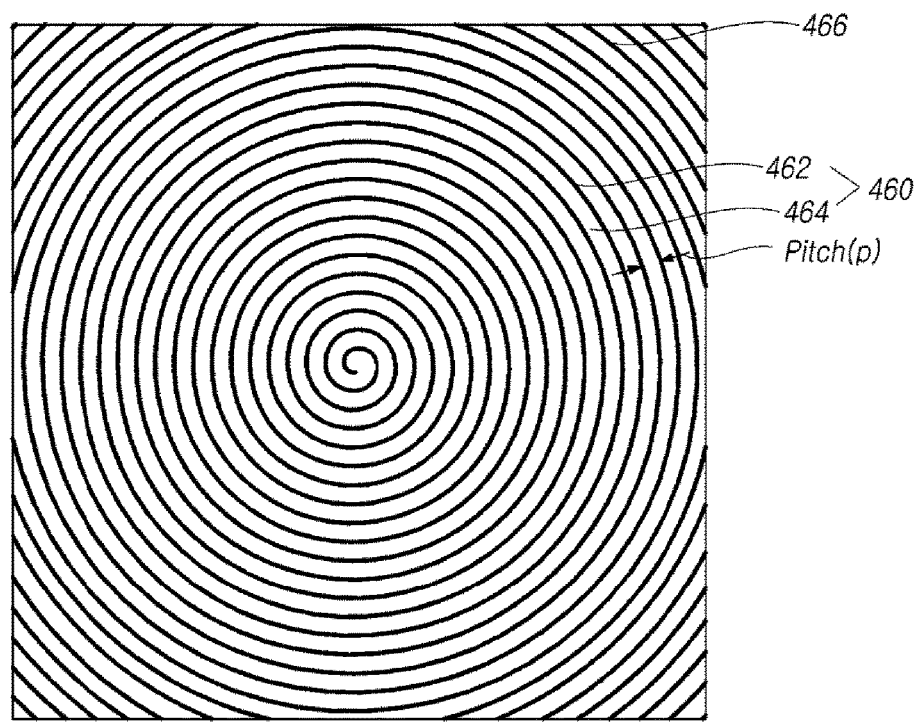
FIGS. 17A and 17B illustrate other examples of shapes of the concave portions and the convex portions of the overcoat layer in FIGS. 15A to 15D.
Figure 17B:
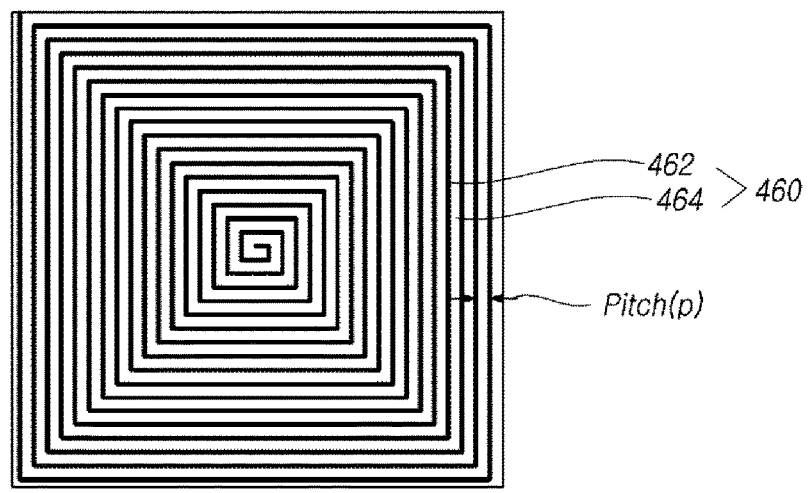

FIGS. 15A to 15D are plan views illustrating an organic light-emitting display device 400 according to another exemplary embodiment, and FIGS. 16A and 16B illustrate other examples of shapes of concave portions 462 and convex portions 464 of an overcoat layer 460 in FIGS. 15A to 15D. Further, FIGS. 17A and 17B illustrate other examples of shapes of the concave portions 462 and the convex portions 464 of the overcoat layer 460 in FIGS. 15A to 15D.

Referring to FIG. 10 and FIGS. 15A to 17B, the organic light-emitting display device 400 according to another exemplary embodiment includes a substrate 310 divided into a display area and a non-display area and the overcoat layer 460 disposed on the substrate 310. The overcoat layer 460 includes two or more concave portions 462 and two or more convex portions 464 having a plan-view pattern selected from among a multi-shape pattern, a plurality of multi-shape patterns having different centers, a spiral shape pattern, and combinations thereof. The organic light-emitting display device 400 further includes a first electrode 332 disposed on the overcoat layer 460, and an organic light-emitting layer 334 disposed on the first electrode 332, and a second electrode 336 disposed on the organic light-emitting layer 334.

Referring to FIGS. 15A to 15D, the two or more concave portions 462 and the two or more convex portions 464 may have a multi-shape pattern in a plan view. The multi-shape pattern may have a portion of which is cut, for example, an outer portion of which is partially cut.

Referring to FIG. 15A, the two or more concave portions 462 and the two or more convex portions 464 may have a circular multi-shape pattern in a plan view, for example, a circular multi-shape pattern 466, an outer portion of which is partially cut. Referring to FIG. 15B, the two or more concave portions 462 and the two or more convex portions 464 may have an oval multi-shape pattern in a plan view, i.e., an oval multi-shape pattern 466, an outer portion of which is partially cut.

Referring to FIG. 15C, the two or more concave portions 462 and the two or more convex portions 464 may have a rhombus multi-shape in a plan view, for example, a polygonal multi-shape, i.e., a tetragonal multi-shape, but are not limited thereto. As illustrated in FIG. 15C, the two or more concave portions 462 and the two or more convex portions 464 may have a rhombus multi-shape 466, in which a portion of a polygonal multi-shape is cut. Referring to FIG. 15D, the two or more concave portions 462 and the two or more convex portions 464 may have a concave diamond multi-shape 468, an outer portion of which is partially out.

Referring to FIGS. 16A and 16B, the two or more concave portions 462 and the two or more convex portions 464 may have a plurality of multi-shapes having different centers in a plan view. The plurality of multi-shapes having the different centers may be a plurality of multi-shapes, some of which are cut, for example, a plurality of multi-shapes in which some of outer multi-shapes are partially cut.

Referring to FIG. 16A, the two or more concave portions 462 and the two or more convex portions 464 may have a plurality of tetragonal multi-shapes having different centers in a plan view. Some of outer tetragonal multi-shape of the plurality of tetragonal multi-shapes having the different centers are illustrated in FIG. 16A as not being cut, but some of the outer tetragonal multi-shapes may be a cut tetragonal multi-shape.

Referring to FIG. 16B, the two or more concave portions 462 and the two or more convex portions 464 may have a plurality of rhombus multi-shapes having different centers in a plan view, i.e., a plurality of rhombus multi-shapes 466 in which some of outer rhombus multi-shapes are cut.

FIGS. 16A and 16B illustrate a plurality of tetragonal multi-shapes having different centers in a plan view and a plurality of rhombus multi-shapes having different centers in a plan view, but the present disclosure is not limited thereto. For example, the two or more concave portions 462 and the two or more convex portions 464 may have a plurality of polygonal multi-shapes having different centers, a plurality of circular multi-shapes having different centers, and a plurality of oval multi-shapes having different centers.

Referring to FIGS. 17A and 17B, the two or more concave portions 462 and the two or more convex portions 464 may have a spiral shape in a plan view. The spiral shape may be a spiral shape, a portion of which is cut, for example, a spiral shape, an outer portion of which is partially cut.

Referring to FIG. 17A, the two or more concave portions 462 and the two or more convex portions 464 may have a circular spiral shape in a plan view, i.e., a spiral shape 466, an outer portion of which is partially cut. Referring to FIG. 17B, the two or more concave portions 462 and the two or more convex portions 464 may have a tetragonal spiral shape in a plan view. The two or more concave portions 462 and the two or more convex portions 464 may have a spiral shape 466, an outer portion of which is partially cut. A portion of an outer tetragonal spiral shape is illustrated in FIG. 17B as not being cut, the portion of the outer tetragonal spiral shape may be a cut tetragonal multi-shape.

FIGS. 17A and 17B illustrate that the two or more concave portions 462 and the two or more convex portions 464 have a circular spiral shape and a tetragonal spiral shape, but the present disclosure is not limited thereto. For example, the two or more concave portions 462 and the two or more convex portions 464 may have a spiral shape or a polygonal spiral shape.

Referring to FIGS. 15A to 17B, since the two or more concave portions 462 or the two or more convex portions 464 have a curved surface formed by extending the concave portion 462 and the convex portion 464, in the same manner as forming the concave portions 362 and the convex portions 364 described above in a linear shape, the pitch p between the two or more concave portions 462 or the two or more convex portions 464 may be reduced to a specific distance or less in an exposure process using a mask.

Referring to FIGS. 15A to 17B, since the pitch p between the two or more concave portions 462 is the same as the pitch p between the two or more convex portions 464 and an organic electroluminescent device has a dense shape emitting light in various directions rather than a single direction, it is possible to improve light extraction efficiency, light extraction efficiency, and a view angle.

As described above, because the organic light-emitting display devices 300 and 400 according to exemplary embodiments do not have a honeycomb structure in which a concave portion surrounds a convex portion or the convex portion surrounds the concave portion, an entire area of a display area actually emitting light is increased by minimizing the pitch between the concave portions 362 or the convex portions 364, thereby further improving light extraction efficiency.

In addition, because the organic light-emitting display device 300 according to exemplary embodiments has further improved light extraction efficiency, it is possible to improve element luminance, efficiency, and a lifespan, and reduce power consumption. In addition, the spiral shape pattern includes a circular spiral shape pattern, a polygonal spiral shape pattern and an oval spiral shape pattern, and combinations thereof. Further, the embodiment include the two or more concave portions and the two or more convex portions forming a plan-view pattern including one of a polygonal pattern having same centers, a polygonal pattern having different centers, a circular pattern having same centers, a circular pattern having different centers, a spiral pattern, and combinations thereof.

Further, the polygonal pattern includes a honeycomb pattern, a hexagonal pattern and combinations thereof. A corresponding convex portion of the polygonal pattern also surrounds a corresponding concave portion of the polygonal pattern. As discussed above, the two or more concave portions and the two or more convex portions further form a plan-view pattern including an oval pattern having same centers, an oval pattern having different centers, and combinations thereof. The spiral shape pattern includes a circular spiral pattern, a polygonal spiral pattern and an oval spiral pattern.

The features, structures, and effects described in the present disclosure are included in at least one embodiment but are not necessarily limited to a particular embodiment. A person skilled in the art can apply the features, structures, and effects illustrated in the particular embodiment to another embodiment by combining or modifying such features, structures, and effects. It should be understood that all such combinations and modifications are included within the scope of the present disclosure.

Although the exemplary embodiments of the present disclosure have been described for illustrative purposes, a person skilled in the art will appreciate that various modifications and applications are possible without departing from the essential characteristics of the present disclosure. For example, the specific components of the exemplary embodiments may be variously modified.

What is claimed is:

1. An organic light-emitting display device comprising:
a substrate including a display area and a non-display area;
a thin film transistor disposed on the substrate in the non-display area;
an electroluminescent device disposed in the display area; and
an overcoat layer disposed on the substrate and including two or more concave portions and two or more convex portions in the display area,
wherein the two or more concave portions and the two or more convex portions form a plan-view pattern including one of a polygonal pattern having same centers, a polygonal pattern having different centers, a circular pattern having same centers, a circular pattern having different centers, an oval pattern having same centers, an oval pattern having different centers, a spiral pattern, and combinations thereof, and
wherein the electroluminescent device includes:
a first electrode disposed on the overcoat layer and connecting the electroluminescent device to the thin film transistor;
an organic light-emitting layer disposed on the first electrode and configured to emit light; and
a second electrode disposed on the organic light-emitting layer.

2. The organic light-emitting display device of claim 1, wherein the polygonal pattern comprises a honeycomb pattern, a hexagonal pattern, a rhombus pattern, a concave diamond pattern, a tetragonal pattern and combinations thereof.

3. The organic light-emitting display device of claim 1, wherein a corresponding convex portion of the polygonal pattern surrounds a corresponding concave portion of the polygonal pattern.

4. The organic light-emitting display device of claim 1, wherein the plan-view pattern of the two or more concave portions and the two or more convex portions have outer portions of which are partially cut.

5. The organic light-emitting display device of claim 1, wherein the two or more concave portions and the two or more convex portions form an extended curved surface.

6. The organic light-emitting display device of claim 1, wherein the spiral shape pattern includes a circular spiral pattern, a polygonal spiral pattern and an oval spiral pattern, and combinations thereof.

7. The organic light-emitting display device of claim 1, wherein a pitch between the two or more concave portions is the same as a pitch between the two or more convex portions.

8. The organic light-emitting display device of claim 1, wherein the first electrode, the organic light-emitting layer and the second electrode include two or more concave portions and two or more convex portions in the display area corresponding to the two or more concave portions and the two or more convex portions of the overcoat layer.

9. The organic light-emitting display device of claim 1, wherein the thin film transistor includes an active layer, a gate electrode, a source electrode, a drain electrode, and a gate insulating film disposed between the active layer and the gate electrode, and
wherein the first electrode includes an extension portion extending from the two or more concave portions and the two or more convex portions to the drain electrode to connect the electroluminescent device to the thin film transistor.

10. An organic light-emitting display device comprising:
a substrate including a display area and a non-display area;
a thin film transistor disposed on the substrate in the non-display area;
an electroluminescent device disposed in the display area; and
an overcoat layer disposed on the substrate and including two or more concave portions and two or more convex portions in the display area,
wherein the two or more concave portions and the two or more convex portions form an extended curved surface, and
wherein the electroluminescent device includes:
a first electrode disposed on the overcoat layer and connecting the electroluminescent device to the thin film transistor;
an organic light-emitting layer disposed on the first electrode and configured to emit light; and
a second electrode disposed on the organic light-emitting layer.

11. The organic light-emitting display device of claim 10, wherein the organic electroluminescent device has a dense shape emitting a light in various directions rather than a single direction.

* * * * *